(12) United States Patent
Ong et al.

(10) Patent No.: US 11,456,516 B2
(45) Date of Patent: Sep. 27, 2022

(54) LOW LOSS HIGH-SPEED INTERCONNECTS

(71) Applicant: Intel Corporation, Santa Clara, CA (US)

(72) Inventors: Ling Li Ong, Bayan Lepas (MY); Kin Wai Lee, Melaka (MY); Bok Eng Cheah, Bukit Gambir (MY); Yang Liang Poh, Penang (MY); Yean Ling Soon, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/030,634

(22) Filed: Sep. 24, 2020

(65) Prior Publication Data

US 2021/0184326 A1   Jun. 17, 2021

(30) Foreign Application Priority Data

Dec. 11, 2019   (MY) ............................ PI2019007400

(51) Int. Cl.
| | | |
|---|---|---|
| *H01P 3/08* | (2006.01) | |
| *H01L 23/552* | (2006.01) | |
| *H01L 23/528* | (2006.01) | |
| *H01L 23/66* | (2006.01) | |

(52) U.S. Cl.
CPC .......... *H01P 3/081* (2013.01); *H01L 23/5286* (2013.01); *H01L 23/552* (2013.01); *H01L 23/66* (2013.01)

(58) Field of Classification Search
CPC ........ H01P 3/087; H01L 23/66; H01L 23/552; H01L 23/5288
See application file for complete search history.

(56) References Cited

U.S. PATENT DOCUMENTS

2010/0182105 A1* 7/2010 Hein .................... H05K 1/0219
                                                                         333/239
2010/0307798 A1* 12/2010 Izadian .................. H05K 1/142
                                                                         174/255

\* cited by examiner

*Primary Examiner* — Stephen E. Jones
*Assistant Examiner* — Kimberly E Glenn
(74) *Attorney, Agent, or Firm* — Schwegman Lundberg & Woessner, P.A.

(57) ABSTRACT

An electronic device and associated methods are disclosed. In one example, the electronic device can include an assembly having asymmetrically situated conductors. In selected examples, the assembly includes a ground plane, a central shield portion, a first side shield portion on a first side, a second side shield portion on a second side, a first conductor asymmetrically situated between the central shield portion and the first side shield portion, a second conductor asymmetrically situated between the central shield portion and the second side shield portion, and dielectric within the assembly.

19 Claims, 5 Drawing Sheets

LOW LOSS HIGH-SPEED INTERCONNECTS

This application claims the benefit of priority to Malaysian Application Serial No. PI2019007400, filed Dec. 11, 2019, which is incorporated herein by reference in its entirety.

TECHNICAL FIELD

Embodiments described herein generally relate to transmission line configurations.

BACKGROUND

Transmission lines are subject to impedance discontinuity and insertion losses. It is desired to have transmission line configurations that address these concerns, and other technical challenges.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Transmission lines are used to propagate electrical signal in a variety of electronic devices, such as printed circuit boards. Transmission line configurations can include, but are not limited to, microstrip and stripline configurations, both including a conducting strip, such as one or more conductors or a differential pair, in and surrounded by dielectric material, and at least one ground plane. In some configurations, a second ground plane can be used. In a transmission line, electrical signal can travel down the conducting strip to be delivered to a desired location.

Electrical signal degradation can occur due to insertion losses, such as due to inclusion of conductors. In other cases, signal degradation can occur due to signal return losses, such as impedance discontinuity. Additionally, resonating frequencies can sometimes result in signal degradation. Electrical signal degradation due to these causes is particularly common where the electrical signal is operating at a high operating frequency, such as above about 56 GHz.

Insertion loss, expressed in decibels (dB), is the loss of signal power resulting from the conductor loss, return loss and dielectric loss in a transmission line. In general, insertion loss can be calculated as:

$$IL(\text{dB}) = 10\log_{10}\frac{P_O}{P_I} \quad (1)$$

Where IL(dB) is the insertion loss in dB, $P_I$ is the input power before insertion and $P_O$ is the output power received by the load after insertion of the device.

Return loss is the loss of signal power return or reflected by a discontinuity in a transmission line. The discontinuity can be, for example, due to a mismatch with the terminating load, or with a device inserted on the transmission line. Return loss can be expressed as:

$$RL(\text{dB}) = 10\log_{10}\frac{P_i}{P_r} \quad (2)$$

Where RL(dB) is the return loss in dB, and $P_i$ is the incident power, and $P_r$ is the reflected power.

The amount of loss can be more significant as the frequency of the signal surges beyond 56 GHz, as described in Equation 3 below.

$$atten\left[\frac{\text{dB}}{\text{in}}\right] \sim \frac{1}{w[mils]}\sqrt{f[\text{GHz}]} + 2.3 \times f[\text{GHz}] \times Df \times \sqrt{Dk} \quad (3)$$

In Equation 3, w is the transmission line width in mils, f is the sine wave frequency in GHz (e.g., the Nyquist function), Df is the dissipation factor, and Dk is the dielectric constant. Due to the amount of loss at or above a frequency of about 56 GHz, gradual dielectric loss scaling can be insignificant at these frequencies by comparison.

The width and length of the transmission line can affect the amount of loss that occurs. In some cases, larger transmission line widths can decrease both insertion loss and channel impedance.

Disclosed herein is a low loss package horizontal interconnect design. The design has a reduced stack-up profile but preserves target impedance for differential signaling for high-speed applications. For example, the design can allow for up to 100 Ω for differential signaling with high-speed (e.g., 56 GHz or more) applications.

Specifically, the electrical interconnect design can include a first reference plane. The first reference plane can include first, second and third shield portions that are spaced apart by first, and second gaps. A dielectric layer can cover the first reference plane. In the dielectric layer can reside first and second conductors lying in the "footprints" of the first and second gaps, but the conductors can be asymmetrically aligned.

The asymmetrical design can allow for improved signal integrity performance for high speed applications and device form-factor miniaturization by reducing substrate (such as a package or printed circuit board) layer counts.

Specifically, insertion loss reduction can be accomplished. The use of larger conductor line widths without package stack-up trade off while preserving target channel impedances. This can additionally allow differential channel impedance scaling up to about 100 Ω compared to conventional 85 Ω or below. This can minimize end-to-end return loss due to channel impedance discontinuities.

Moreover, the design can help, for example, reduce channel radiation or resonating frequencies by the use of periodic vertical via coupled between top and bottom reference planes of the design.

Additionally, the device can be miniaturized by reducing the total package substrate layer count. Instead, the design can allow for embedded microstrip routing compared to conventional strip-line routing, although various types of conventional planar transmission line configurations can be modified with the proposed asymmetric design.

Figure 1A:
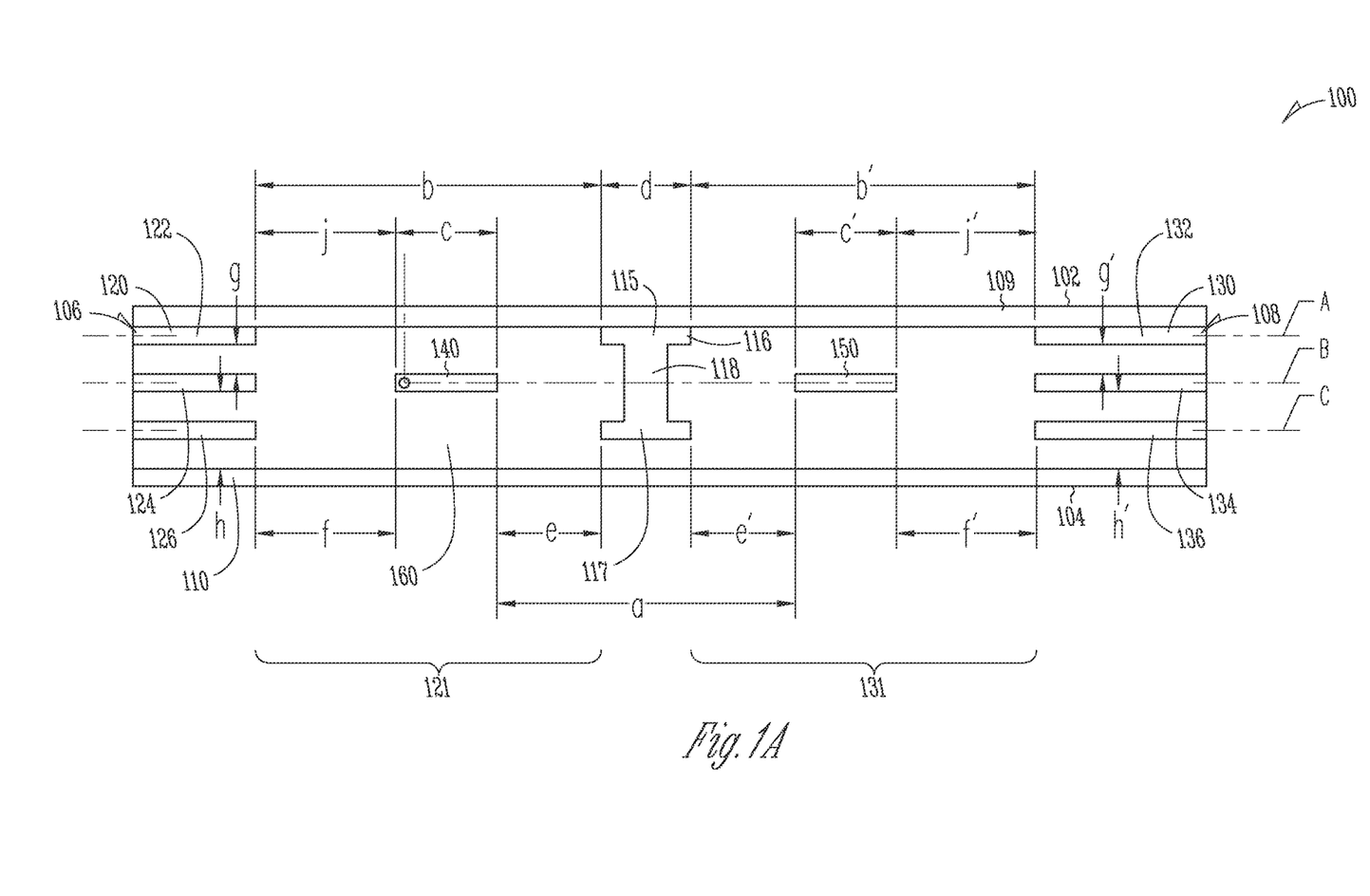
FIG. 1A is a schematic drawing of a horizontal interconnect design in various embodiments.

FIG. 1A is a schematic drawing of a package design (such as a semiconductor package, printed circuit board, or cable package) with a horizontal interconnect design 100 in various embodiments. Interconnect 100 can be an asymmetrical guided-interconnect design for high-speed bus applications. For example, interconnect 100 could be used for a SerDes (serializer/de-serializer) at a high speed of about 56 GHz, such as for an ethernet application.

Figure 1B:
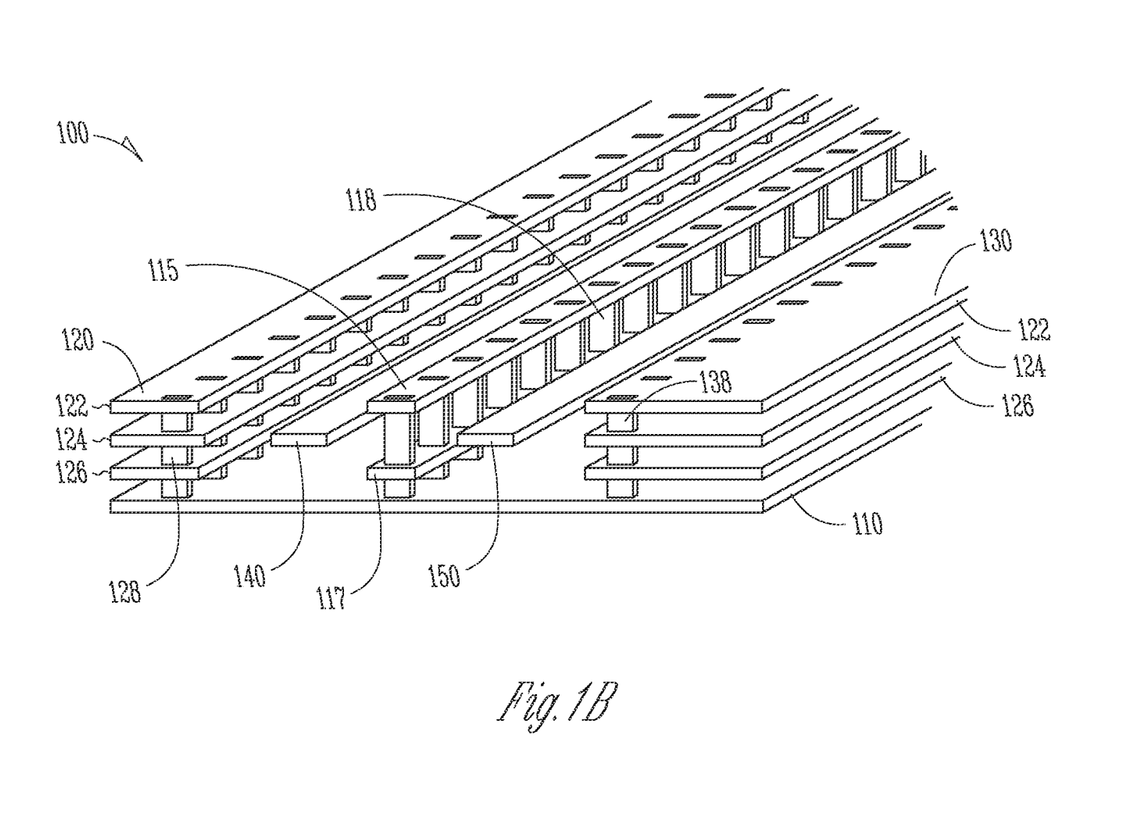
FIG. 1B is a perspective view of a low loss horizontal interconnect design in various embodiments.

FIG. 1B is a perspective view of a low loss horizontal interconnect design 100 in various embodiments. FIGS. 1A and 1B will be discussed together.

Interconnect 100 of FIGS. 1A-1B is in a microstrip configuration, although alternative configurations, such as stripline configurations, are also envisioned. A microstrip configuration can be used for electrical signals transmission, for example, microwave-frequency signals transmission. A microstrip configuration can include, for example, a conducting strip (e.g., conductors, such as a differential pair) separated from a ground plane by a dielectric layer. Components such as antenna, couplers, filters, power dividers, or others, can use microstrip-type configured transmission lines.

Interconnect 100 can include three horizontal reference planes: top reference plane A, middle reference plane B, and bottom reference plane C. The reference planes run parallel each other, with top reference plane A closer to a top surface 102 of interconnect 100, and bottom reference plane C closer a bottom surface 104 of interconnect 100. Middle reference plane B can be in the middle of the interconnect. Each reference plane can carry a reference voltage, such as ground voltage (Vss) or power supply voltage (Vcc).

Interconnect 100 can include top surface 102, bottom surface 104, first side 106, and second side 108. Interconnect 100 can further include solder resist or solder mask layer 109, ground plane 110, central shield portion 115, first side shield portion 120, second side shield portion 130, first conductor 140, second conductor 150, and dielectric 160.

Central shield portion 115 can run between top surface 102 towards bottom surface 104 in the center of interconnect 100. First side shield portion 120 can run between top surface 102 and bottom surface 104 at first side 106. First side shield portion 120 can be spaced apart from central shield portion 115 by first gap 121. Second side shield portion 130 can run between top surface 102 and bottom surface 104 at second side 108. Second side shield portion 130 can be spaced apart from central shield portion 115 by second gap 131.

First conductor 140 can reside in first gap 121 between central shield portion 115 and first side shield portion 120. Second conductor 150 can reside in second gap 131 between central shield portion 115 and second side shield portion 130. Dielectric 160 can fill interconnect 100 between shield portions 115, 120, 130, and around conductors 140, 150.

Solder resist layer 109 can cap interconnect 100 at top surface 102. Solder resist layer 109 can be, for example, an insulation or dielectric material. Solder resist layer 109 can be, in some cases, a polyimide or a liquid crystal polymer material.

Ground plane 110 can serve as a base for interconnect 100 on bottom surface 104. Ground plane 110 can serve as a reference plane, having a reference voltage, such as ground reference voltage (Vss). Ground plane 110 can serve as the current return path for the conductors 140, 150 in microstrip configuration.

Central shield portion 115, near the central part of interconnect 100 in dielectric 160, can include layers 116, 117, connected by via 118. Layers 116, 117, can be horizontal layers on either end of vertical via 118.

First side shield portion 120, near first side 106 of interconnect 100, can include layers 122, 124, 126, and via 128. Layers 122, 124, 126, can be horizontal layers generally parallel to ground plane 110, and to each other. Layers 122, 124, 126, can be made of conductive material, for example, copper and coupled to a ground (Vss) or power (Vcc) reference voltage. In interconnect 100, layers 122, 124, 126 can be of generally the same width and length. Layers 122, 124, 126 can align with, for example, reference planes A, B, and C, respectively. Each reference plane can carry a reference voltage, such as a ground (Vss) or power (Vcc) reference voltage.

In first shield portion 120, line g represents the distance from layer 122 to layer 124, while line h represents the distance from layer 124 to ground plane 110. The ratio of distances g:h can be, for example, about 1:2 to about 1:3.

Via 128 can be, for example, a vertical via that runs orthogonal to layers 122, 124, 126, connecting the layers to each other and intersecting them. In some cases, via 128 can reach to ground plane 110.

First side shield portion 120 can be separated from central shield portion 115 by gap 121. First conductor 140 can reside in gap 121. First side shield portion 120, including layers 122, 124, 126, and vertical via 128, can serve to shield first conductor 140 from adjacent or outside electromagnetic interference (EMI).

Second side shield portion 130, near second side 108 of interconnect 100, can include layers 132, 134, 136, and via 138. Layers 132, 134, 136, can be horizontal layers generally parallel to ground plane 110, and to each other. Layers 132, 134, 136, can be made of conductive material, for example, copper and coupled to a ground (Vss) or power (Vcc) reference voltage. In interconnect 100, layers 132, 134, 136 can be of generally the same width and length. Layers 132, 134, 136 can align with, for example, reference planes A, B, and C, respectively. Each reference plane can carry a reference voltage, such as a ground (Vss) or power (Vcc) reference voltage.

In second shield portion 130, line g' represents the distance from layer 132 to layer 134, while line h' represents the distance from layer 134 to ground plane 110. The ratio of distances g':h' can be, for example, about 1:2 to about 1:3.

Via 138 can be, for example, a vertical via that runs orthogonal to layers 132, 134, 136, connecting the layers to each other and intersecting them. In some cases, via 138 can reach to ground plane 110.

Second side shield portion 130 can be separated from central shield portion 115 by gap 131. Second conductor 150 can reside in gap 131. Second side shield portion 130, including layers 132, 134, 136, and vertical via 138, can serve to shield second conductor 150 from adjacent or outside EMI.

First conductor 140 and second conductor 150 can be, for example a differential pair. In some cases, first and second conductors 140, 150, can carry a complementary electrical signal, such as a differential bus with a transmission data rate of at least 10 GHz. First and second conductors 140, 150, can be situated in gaps 121, 131, respectively, surrounded by dielectric 160.

In interconnect 100, line b represents the width of first gap 121. Line c represents the width of first conductor 140. The ratio of widths c:b can be, for example, about 1:3 to about 1:5.

Similarly, in interconnect 100, line b' represents the width of second gap 131. Line c' represents the width of first conductor 150. The ratio of widths c': b' can be, for example, about 1:3 to about 1:5.

First conductor 140 can be asymmetrically situated in gap 121 between central shield portion 115 and first side shield portion 120. In interconnect 100, line e shows the distance between first conductor 140 and central shielding portion 115. Line f shows the distance between first conductor 140 and first side shield portion 120. In interconnect 100, ratio of distances e:f can be, for example, between about 1:1.5 to about 1:10.

Similarly, second conductor 150 can be asymmetrically situated in gap 131 between central shield portion 115 and second side shield portion 130. In interconnect 100, line e' shows the distance between second conductor 150 and central shielding portion 115. Line f' shows the distance between second conductor 150 and second side shield portion 130. In interconnect 100, ratio of distances e':f' can be, for example, between about 1:1.5 to about 1:10.

Dielectric 160 can fill space in interconnect 100 between solder resist layer 109 and ground plane 110. Dielectric 160 can fill space between layers 122, 124, 126, of first side shield portion 120, and dielectric 160 can fill space between layers 132, 134, 136 of second side shield portion 130.

The asymmetric placement of the conductors 140, 150, can allow for reduced signal loss and impedance discontinuity. An example layout for interconnect 100 is summarized below in Table 1.

TABLE 1

Example Design Layout

| Notation | Example Distance (μm) | Description |
| --- | --- | --- |
| a | 220 | Horizontal distance from first conductor 140 to second conductor 150 |
| b | 285 | Width of first gap 121 |
| b' | 285 | Width of second gap 131 |
| c | 95 | Width of first conductor 140 |
| c' | 95 | Width of second conductor 150 |
| d | 80 | Width of central shield portion 115 |
| e | 70 | Horizontal distance from central shield portion 115 to first conductor 140 |
| e' | 70 | Horizontal distance from central shield portion 115 to second conductor 150 |
| f | 120 | Horizontal distance from first side shield portion 120 to first conductor 140 |
| f' | 120 | Horizontal distance from second side shield portion 130 to second conductor 150 |
| g | 25 | Height between first layer 122 and second layer 124 |
| g' | 25 | Height between first layer 132 and second layer 134 |
| h | 65 | Height between ground plane 110 and second layer 124 |
| h' | 65 | Height between ground plane 110 and second layer 134 |
| j | 120 | Horizontal distance from second layer 124 to first conductor 140 |
| j' | 120 | Horizontal distance from second layer 134 to second conductor 150 |

The proposed example layout with appropriate ratios for asymmetric layout of conductors produced improved insertion losses, summarized in Table 1.

TABLE 2

Example Insertion Losses

| Nyquist Frequency (GHz) | Insertion Loss (dB/mm) |
| --- | --- |
| 28 | 0.074 |
| 56 | 0.129 |

FIG. 1B shows interconnect 100 from a three-dimensional view. In FIG. 1B, extended dimension of shield portions 115, 120, 130, can be seen. Shield portions 115, 120, 130 can include multiple layers of shield material connected though via e.g., vias 118, 128 and 138. Where continuously built out and/or stacked, various shield portions can be aligned so that corresponding gaps also align.

As desired, various shield portions can be coupled to each other across conductors through additional via to minimize channel radiation or rippling effects. The distance between via can be configured according to the wavelength ratio of the data rate e.g., wavelength (λ)/6. For example, where the signal frequency is 56 GHz, λ would be about 2.9 mm. This would induce periodical vertical via spaced apart from one another every 0.484 mm along the transmission line. In this way, interconnect 100 can be built out to the desired size.

Figure 2:
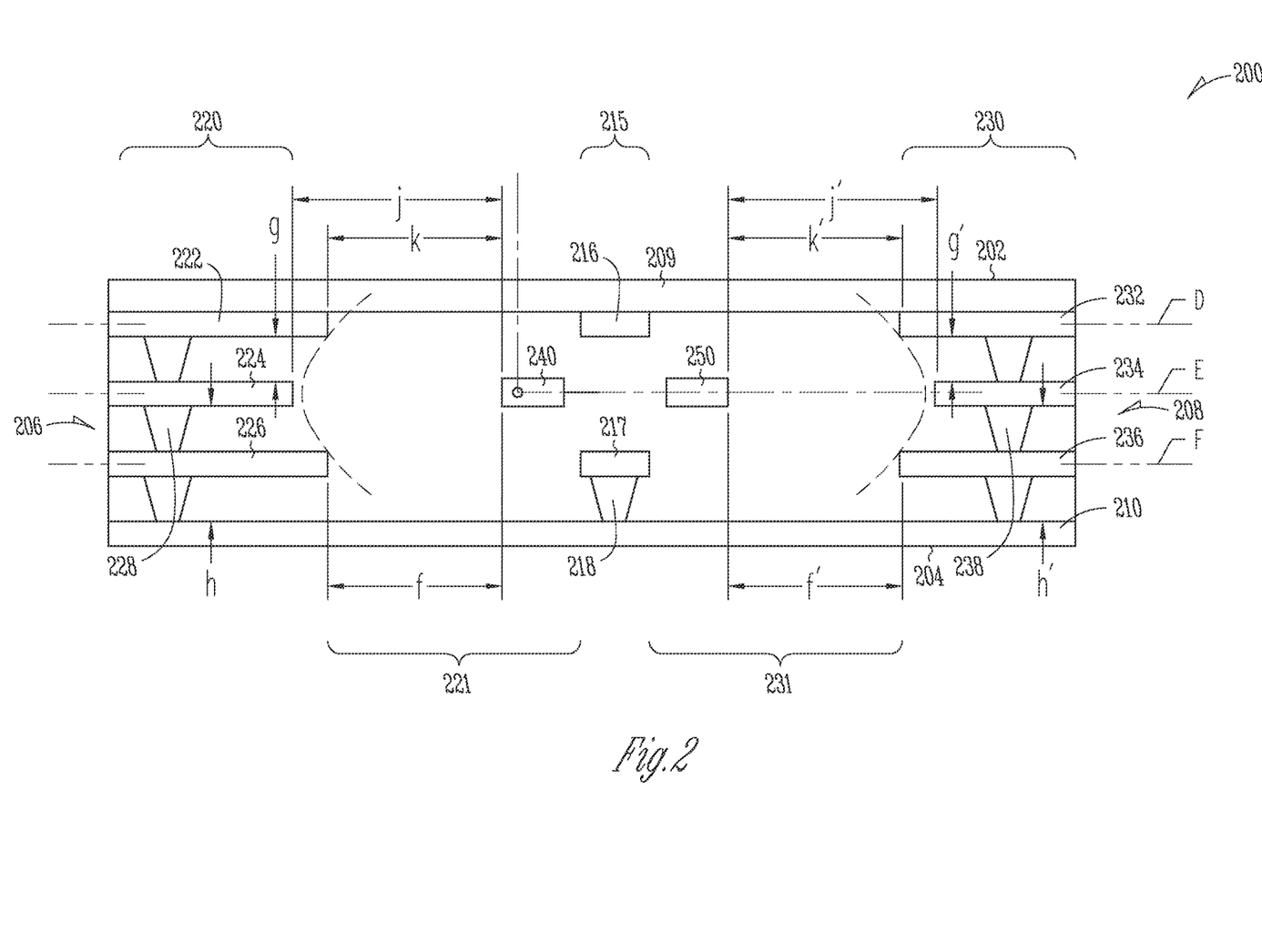
FIG. 2 is a schematic drawing of a concave interconnect design in various embodiments.

FIG. 2 is a schematic drawing of a concave interconnect design 200 in various embodiments. Interconnect 200 includes a design using a concave curvature.

Interconnect 200 can have a top surface 202, bottom surface 204, first side 206, and second side 208. In FIG. 2, three references planes can be seen. First reference plane D runs along layers of shield portions closer top surface 202, second reference plane E runs along layers of shield portions near the middle of interconnect 200, and third reference plane F runs along layers of shield portions closer bottom surface 204. Reference planes D, E, and F can have reference voltages, such as ground (Vss) or power (Vcc) reference voltages.

Interconnect 200 can further include solder resist layer 209, ground plane 210, central shield portion 215, first side shield portion 220, second side shield portion 230, first conductor 240, second conductor 250, and dielectric 260. The components of interconnect 200 are similar to the corresponding components of interconnect 100, and are connected in the same fashion as described above, except where otherwise noted.

Central shield portion 215, near the center of interconnect 200, can include layers 216, 217, and via 218. Central shield portion 215 is not connected in this configuration, compared to the configuration in interconnect 100 above. Layer 216 of central shield portion 215 can lie in reference plane D. Layer 217 of central shield portion 215 can lie in reference plane F. Layers 216, 217 can carry a reference voltage, such as a ground (Vss) or power (Vcc) reference voltage. Central shield portion 215 does not contain a layer in reference plane E.

First side shield portion 220, near first side 206 of interconnect 200, can include layers 222, 224, 226, and via 228. Layers 222, 224, 226, can be horizontal layers generally parallel to ground plane 210, and to each other. In interconnect 200, layers 222, 226 can be of generally the same width and length, but layer 224 can be shorter. Layers 222, 224, 226 can align with, for example, reference planes D, E, and F, respectively. Each layer can carry a reference voltage, such as a ground (Vss) or power (Vcc) reference voltage.

In first side shield portion 220, line g represents the distance from layer 222 to layer 224, while line h represents the distance from layer 224 to ground plane 210. The ratio of distances g:h can be, for example, about 1:2 to about 1:3.

Via 228 can be, for example, a vertical via that runs orthogonal to layers 222, 224, 226, connecting the layers to each other and intersecting them. In some cases, via 228 can reach to ground plane 210.

First side shield portion 220 can be separated from central shield portion 215 by gap 221. First conductor 240 can reside in gap 221. First side shield portion 220, including layers 222, 224, 226, and vertical via 228, can serve to shield first conductor 240 from adjacent or outside electromagnetic interference (EMI).

First side shield portion 220 is different from portion 120 of interconnect 100 in that first side shield portion 220 has layer 224 which is of shorter width than nearby layers 222, 226.

In FIG. 2, line k represents the distance along plane D from first side shield portion 220 layer 222 towards conductor 240. Likewise, line f represents the distance along plane F from first side shield portion 220 layer 226 towards conductor 240. Distances k and f can be equal.

Line j, however, represents the distance along plane E from first side shield portion 220 layer 224 towards conductor 240. The distance j is longer than the distance k or f. The ratio between distances k:j can be, for example, about 1:1.2 to about 1:2. Similarly, the ratio between distances f:j can be, for example, about 1:1.2 to about 1:2. The ratios k:j and f:j are equal in the configuration shown in FIG. 2.

Second side shield portion 230, near second side 208 of interconnect 200, can include layers 232, 234, 236, and via 238. Layers 232, 234, 236, can be horizontal layers generally parallel to ground plane 210, and to each other. In interconnect 200, layers 232, 236 can be of generally the same width and length, but layer 234 can be shorter. Layers 232, 234, 236 can align with, for example, reference planes D, E, and F, respectively. Each layer can carry a reference voltage, such as a ground (Vss) or power (Vcc) reference voltage.

In second side shield portion 230, line g' represents the vertical distance from layer 232 to layer 234, while line h' represents the distance from layer 234 to ground plane 210. The ratio of distances g':h' can be, for example, about 1:2 to about 1:3.

Via 238 can be, for example, a vertical via that runs orthogonal to layers 232, 234, 236, connecting the layers to each other and intersecting them. In some cases, via 238 can reach to ground plane 210.

Second side shield portion 230 can be separated from central shield portion 215 by gap 231. Second conductor 250 can reside in gap 231. Second side shield portion 230, including layers 232, 234, 236, and vertical via 238, can serve to shield second conductor 250 from adjacent or outside electromagnetic interference (EMI).

Second side shield portion 230 is different from portion 130 of interconnect 100 in that first side shield portion 230 has layer 234 which is of shorter width than nearby layers 232, 236.

In FIG. 2, line k' represents the distance along plane D from second side shield portion 230 layer 232 towards conductor 250. Likewise, line f' represents the distance along plane F from second side shield portion 230 layer 236 towards conductor 250. Distances k' and f' can be equal.

Line f', however, represents the distance along plane E from second side shield portion 230 layer 234 towards conductor 250. The distance j' is longer than the distance k' or f'. The ratio between distances k':j' can be, for example, about 1:1.2 to about 1:2. Similarly, the ratio between distances f':j' can be, for example, about 1:1.2 to about 1:2. The ratios k':j' and f':j' are equal in the configuration shown in FIG. 2.

The various layers 222, 224, 226, 232, 234, 236, can be coupled, through via 236, 238 to ground plane 210, which can serve as a subsequent reference plane extending past the layers across interconnect 200. The layers 222, 224, 226, 232, 234, 236, can be associated with a reference voltage, such as a ground (Vss) or power (Vcc) reference voltage to facilitate an electrical current return path.

Additionally, first conductor 240 and second conductor 250 are asymmetrically placed in gaps 221, 231, respectively. First conductor 240 and second conductor 250 are situated closer to central shield portion 215 than to first side shield portion 220 and second side shield portion 230, respectively.

The geometric design of interconnect 200, including the placement of conductors and reference fields, allows for reduction of losses and impedance discontinuity. Table 3 shows an example of such as geometric configuration.

TABLE 3

Example Distances in Concave Design.

| Notation | Distance (μm) | Description |
|---|---|---|
| g | 25 | Height between layer 222 and layer 224 |
| g' | 25 | Height between layer 232 and layer 234 |
| h | 65 | Height between layer 224 and ground plane 210 |
| h' | 65 | Height between layer 234 and ground plane 210 |
| k | 100 | Distance from layer 222 to conductor 240 on plane D |
| k' | 100 | Distance from layer 232 to conductor 250 on plane D |
| f | 100 | Distance from layer 226 to conductor 240 on plane F |
| f' | 100 | Distance from layer 236 to conductor 250 on plane F |
| j | 120 | Distance from layer 224 to conductor 240 on plane E |
| j' | 120 | Distance from layer 234 to conductor 250 on plane E |

The example described in reference to Table 3 showed a differential impedance of about 97 Ohm.

The configuration of interconnect 200 using a concave curvature design allows spacing between the conductors 240, 250 and layers 224, 234, reference plane E. This can allow for reduction of electromagnetic coupling from adjacent signal conductors.

Figure 3:
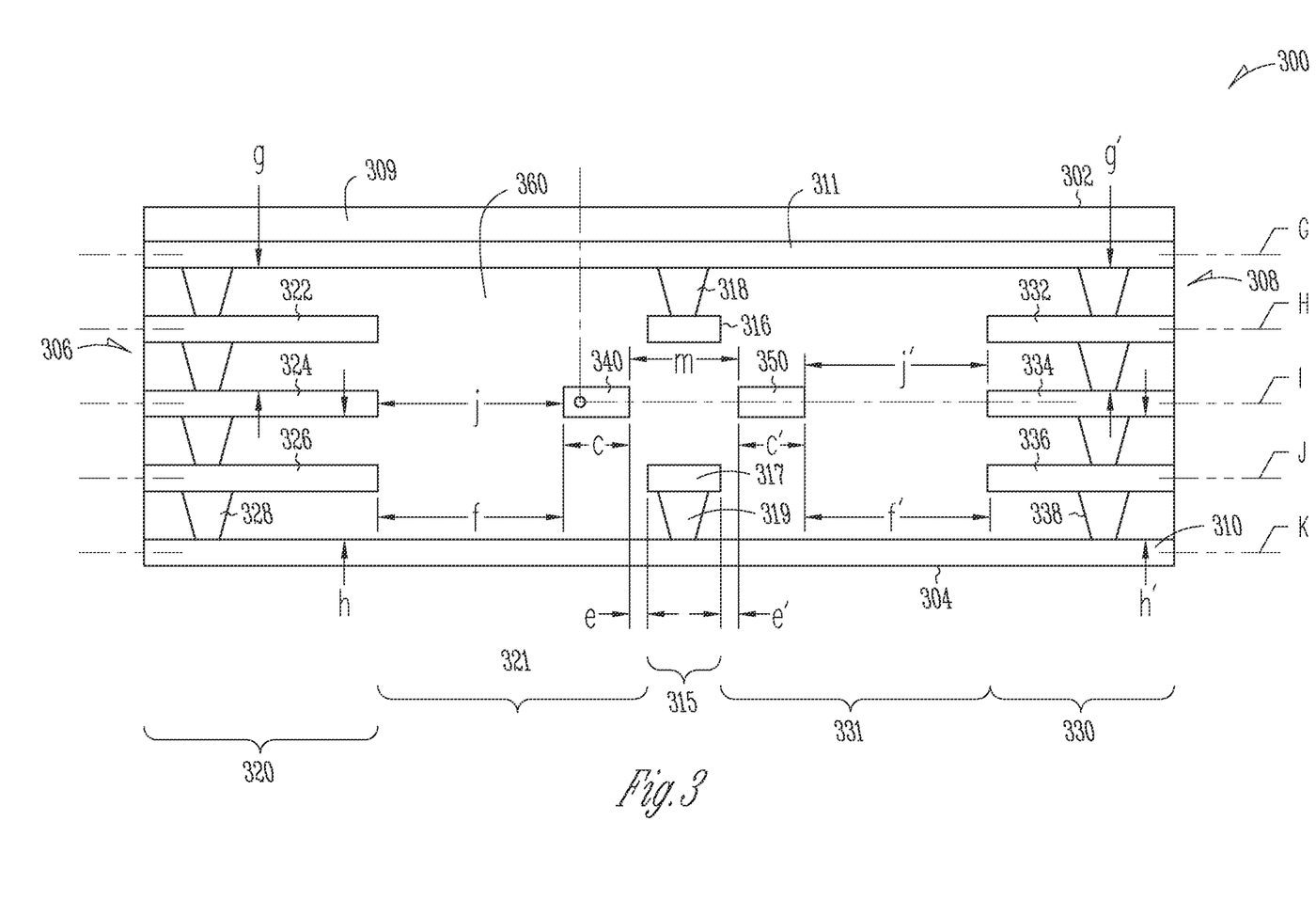
FIG. 3 is a schematic drawing of an asymmetrical interconnect design in various embodiments.

FIG. 3 is a schematic drawing of an asymmetrical interconnect design 300 in various embodiments. Interconnect 300 shows a stripline routing configuration using an asymmetrical guided interconnect design.

The stripline configuration differs from a microstrip configuration (shown in FIGS. 1A-1B) in that the stripline configuration includes a line conductor trace sandwiched between two reference planes and a dielectric material. Together, the conductor trace and the two reference planes, form the controlled impedance. The value of the impedance can be determined by its physical construction, and electrical characteristics of the dielectric. Specifically, the width and thickness of the conductor trace, the dielectric constant and height of the material on either side of the conductor trace, and the configuration of conductor traces and planes can affect the impedance value.

Here, stripline interconnect 300 can have a top surface 302, bottom surface 304, first side 306, and second side 308. In FIG. 3, several references planes can be seen. Reference plane H runs along layers of shield portions near the middle of interconnect 300, reference plane I runs along layers of shield portions also near the middle of interconnect 300, and reference plane J runs along layers of shield portions near bottom surface 304. Reference planes H, I, J can have reference voltages, such as ground (Vss) or power (Vcc) reference voltages. First ground plane 310 can run along bottom surface 304, second ground plane 311 can run along top surface 302. First and second ground planes 310, 311, can run parallel to reference planes H, I, J.

Interconnect 300 can include solder resist layer 309, first ground plane 310, second ground plane 311, central shield portion 315, first side shield portion 320, second side shield portion 330, first conductor 340, second conductor 350, and dielectric 360. The components of interconnect 300 are similar to the corresponding components of interconnect 100, and are connected in the same fashion as described above, except where otherwise noted.

Ground planes 310, 311, sandwich interconnect 300, with dielectric 360 and shield portions 315, 320, 330, in between. Ground planes 310, 311, can maintain a reference voltage, such as ground reference voltage (Vss).

Central shield portion 315, near the center of interconnect 300, can include layers 316, 317, and vias 318, 319. Central shield portion 315 is not connected in this configuration, compared to the configuration in interconnect 100 above. Layer 316 of central shield portion 315 can lie in reference plane H. Layer 317 of central shield portion 315 can lie in reference plane J. Layers 316, 317, can be connected to ground planes 310, 311, by vertical vias 318, 319, respectively. Layers 316, 317 can carry a reference voltage, such as a ground (Vss) or power (Vcc) reference voltage. Central shield portion 315 does not contain a layer in reference plane I.

First side shield portion 320, near first side 306 of interconnect 300, can include layers 322, 324, 326, and via 328. Layers 322, 324, 326, can be horizontal layers generally parallel to ground planes 310, 311, and to each other. In interconnect 300, layers 322, 324, 326 can be of generally the same width and length. Layers 322, 324, 326 can align with, for example, reference planes H, I, and J, respectively. Each layer can carry a reference voltage, such as a ground (Vss) or power (Vcc) reference voltage.

In first side shield portion 320, line g represents the distance from second ground plane 311 to layer 324, while line h represents the distance from layer 324 to first ground plane 310. The ratio of distances g:h can be, for example, about 1:1. Via 328 can be, for example, a vertical via that runs orthogonal to layers 322, 324, 326, connecting the layers to each other and intersecting them.

First side shield portion 320 can be separated from central shield portion 315 by gap 321. First conductor 340 can reside in gap 321. First side shield portion 320, including layers 322, 324, 326, and vertical via 328, can serve to shield first conductor 340 from adjacent or outside electromagnetic interference (EMI).

Second side shield portion 330, near second side 308 of interconnect 300, can include layers 332, 334, 336, and via 338. Layers 332, 334, 336, can be horizontal layers generally parallel to ground planes 310, 311, and to each other. In interconnect 300, layers 332, 334, 336 can be of generally the same width and length. Layers 332, 334, 336 can align with, for example, reference planes H, I, and J, respectively. Each layer can carry a reference voltage, such as a ground (Vss) or power (Vcc) reference voltage.

In second side shield portion 330, line g' represents the distance from second ground plane 311 to layer 334, while line h' represents the distance from layer 334 to first ground plane 310. The ratio of distances g':h' can be, for example, about 1:1. Via 338 can be, for example, a vertical via that runs orthogonal to layers 332, 334, 336, connecting the layers to each other and intersecting them.

Second side shield portion 330 can be separated from central shield portion 315 by gap 331. Second conductor 350 can reside in gap 331. Second side shield portion 330, including layers 332, 334, 336, and vertical via 338, can serve to shield second conductor 350 from adjacent or outside electromagnetic interference (EMI).

First conductor 340 and second conductor 350 can be, for example a differential pair. In some cases, first and second conductors 340, 350, can carry a complementary electrical signal, such as a differential bus with a transmission data rate of at least 10 GHz. First and second conductors 340, 350, can be situated in gaps 321, 331, respectively, surrounded by dielectric 360.

In interconnect 300, first conductor 340 is situated in gap 321 such that first conductor 340 is closer to central shield portion 315 than to first side shield portion 320. Similarly, second conductor 350 is situated in gap 331 closer to central shield portion 315 than to second side shield portion 330. In this example, stripline interconnect 300 includes a differential pair of conductors 340, 350, that are vertically centered, although other versions with the differential pair vertically offset are also envisioned.

Table 4 below gives an example of distances that might be used in such as configuration.

TABLE 4

Example Distances in Strip-Line Design.

| Notation | Distance (μm) | Description |
|---|---|---|
| g | 65 | Height between second ground plane 311 and layer 324 |
| g' | 65 | Height between second ground plane 311 and layer 334 |
| h | 65 | Height between layer 324 and first ground plane 310 |
| h' | 65 | Height between layer 334 and first ground plane 310 |
| c | 60 | Width of first conductor 340 |
| c' | 60 | Width of second conductor 350 |
| m | 240 | Horizontal distance between first and second conductors 340, 350 |
| d | 80 | Width of central shield portion 315 |
| f | 120 | Horizontal distance from first side shield portion 320 to first conductor 340 |
| f' | 120 | Horizontal distance from second side shield portion 330 to second conductor 350 |
| e | 80 | Horizontal distance from central shield portion 315 to first conductor 340 |
| e' | 80 | Horizontal distance from central shield portion 315 to second conductor 350 |
| j | 120 | Horizontal distance from layer 324 to first conductor 340 |
| j' | 120 | Horizontal distance from layer 334 to second conductor 350 |

In the Example of Table 4, the interconnect 300 showed improved (i.e., less overall) insertion losses at various speeds compared to conventional configurations.

TABLE 5

Example Insertion Losses

| Nyquist Frequency (GHz) | insertion Loss (dB/mm) |
|---|---|
| 28 | 0.086 |
| 56 | 0.146 |

Overall, the use of asymmetrically situated conductors can allow for less insertion loss and impedance discontinuity for both microstrip and stripline configuration transmission lines. Table 6 below shows example, average results of insertion loss (IL) at 28 GHz and at 56 GHz of both these configurations compared to a conventional stripline configuration, and depicts the difference in impedance shown in Ohms (Ω), where a target impedance is 100 Ω. The "trace width" refers to the width of the conductors used in the transmission line.

TABLE 6

Comparison of Insertion Loss in various geometries.

|  | Trace Width (μm) | Impedance (Ω) | IL at 28 GHz per length (dB/mm) | IL at 56 GHz per length (dB/mm) |
| --- | --- | --- | --- | --- |
| Control Conventional Stripline | 45 | 93.0 | 0.092 | 0.158 |
| Example 1 Asymmetrical Micro strip | 95 | 97.1 | 0.074 | 0.129 |
| Example 2 Asymmetrical Stripline | 60 | 97.4 | 0.086 | 0.146 |

The asymmetric guided transmission lines appear to achieve lower insertion loss while providing flexibility for channel impedance to scale, up to 100 Ω. This can allow for improved system end-to-end impedance matching.

The proposed interconnect configurations can be used, for example, in data-centric and networking devices, such as a SerDes Ethernet, or other items used for high bandwidth data transfer and communications.

Figure 4:
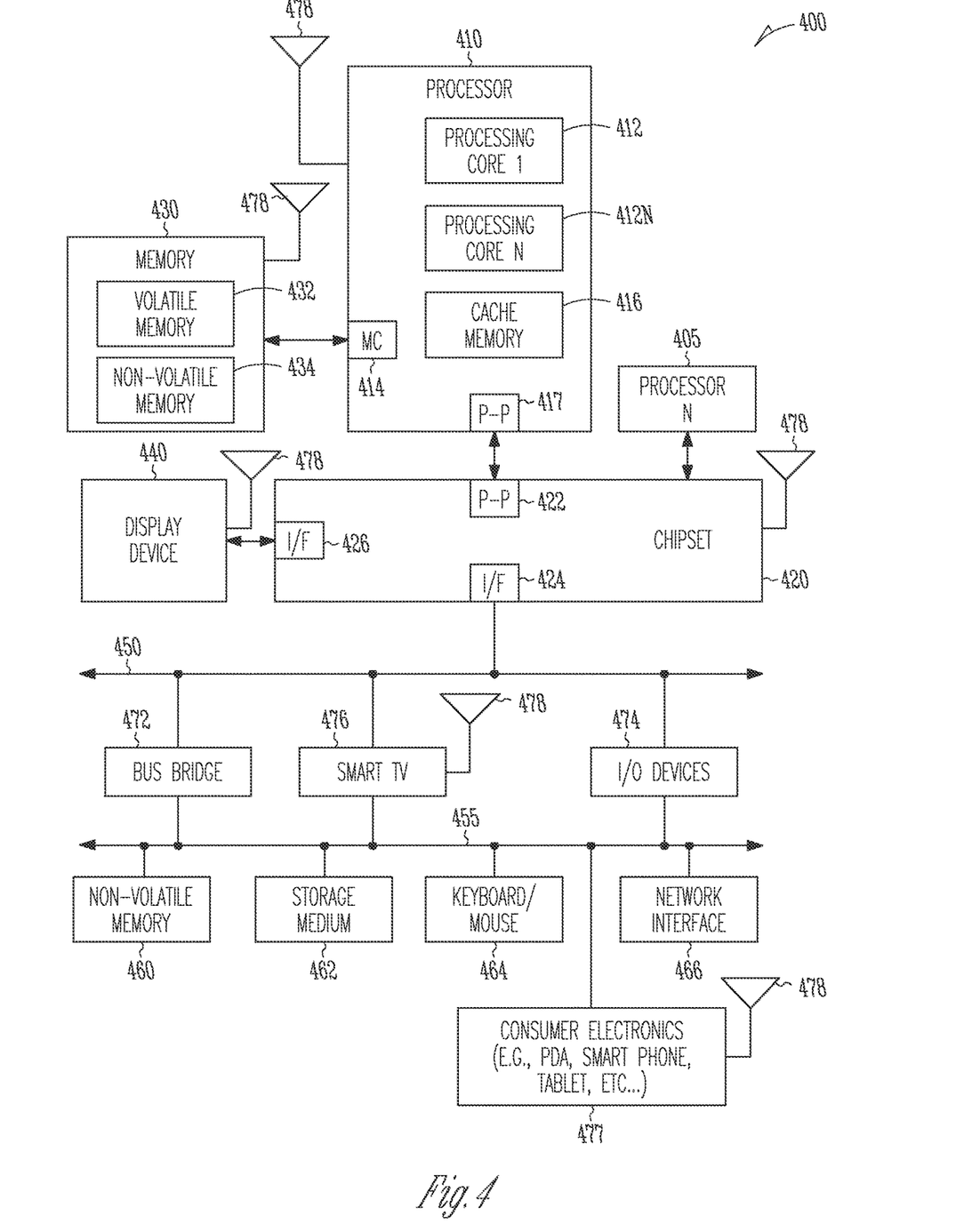
FIG. 4 shows a system that may incorporate a low loss horizontal interconnect design and methods, in accordance with some example embodiments.

FIG. 4 illustrates a system level diagram, depicting an example of an electronic device (e.g., system) that may include a semiconductor package with low loss horizontal interconnect design and/or methods described above. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 includes a system on a chip (SOC) system.

In one embodiment, processor 410 has one or more processor cores 412 and 412N, where 412N represents the Nth processor core inside processor 410 where N is a positive integer. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, an interface for wireless antenna 478 operates in accordance with, but is not limited to, the IEEE 802.11 standard and its related family, Home Plug AV (HPAV), Ultra-Wide Band (UWB), Bluetooth, WiMAX, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the example system, interfaces 417 and 422 operate in accordance with a PtP communication protocol such as the Intel® Quick Path Interconnect (QPI) or the like. In other embodiments, a different interconnect may be used.

In some embodiments, chipset 420 is operable to communicate with processor 410, 405N, display device 440, and other devices, including a bus bridge 472, a smart TV 476, I/O devices 474, nonvolatile memory 460, a storage medium (such as one or more mass storage devices) 462, a keyboard/mouse 464, a network interface 466, and various forms of consumer electronics 477 (such as a PDA, smart phone, tablet etc.), etc. In one embodiment, chipset 420 couples with these devices through an interface 424. Chipset 420 may also be coupled to a wireless antenna 478 to communicate with any device configured to transmit and/or receive wireless signals. In one example, any combination of components in a chipset may include a semiconductor package with low loss horizontal interconnect design and/or methods described in the present disclosure.

Chipset 420 connects to display device 440 via interface 426. Display 440 may be, for example, a liquid crystal display (LCD), a light emitting diode (LED) array, an organic light emitting diode (OLED) array, or any other form of visual display device. In some embodiments of the example system, processor 410 and chipset 420 are merged into a single SOC. In addition, chipset 420 connects to one or more buses 450 and 455 that interconnect various system elements, such as I/O devices 474, nonvolatile memory 460, storage medium 462, a keyboard/mouse 464, and network interface 466. Buses 450 and 455 may be interconnected together via a bus bridge 472.

In one embodiment, mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

To better illustrate the method and apparatuses disclosed herein, a non-limiting list of embodiments is provided here:

Example 1 can include an assembly, comprising: a ground plane on a bottom surface; a top surface opposite the bottom surface; a central shield portion extending between the bottom surface and the top surface, a first side shield portion on a first side of the assembly, spaced apart from the central shield portion by a first gap, a second side shield portion on a second side of the assembly, spaced apart from the central shield portion by a second gap, a first conductor situated laterally asymmetric in the first gap, a second conductor situated laterally asymmetric in the second gap, and dielectric interspersed in and around the central shield portion, the first side shield portion, and the second side portion, the dielectric extending from the top surface to the bottom surface. The central shield portion includes one or more central reference layers parallel the ground plane and one or more a via vertically coupling together the one or more central reference layers. The first side shield portion includes one or more first side reference layers parallel the ground plane and one or more via vertically coupling together the one or more first side reference layers. The second side shield portion includes one or more second side reference layers parallel the ground plane and one or more via vertically coupling together the one or more second side reference layers.

Example 2 can include Example 1, wherein the ratio of the distance from the first conductor to the central shield portion compared to the distance from the first conductor to the first side shield portion is about 1:1.5 to about 1:10.

Example 3 can include any of Examples 1-2, wherein the ratio of the distance from the first conductor to the central shield portion compared to the distance from the first conductor to the first side shield portion is about equal to the ratio of the distance from the second conductor to the central shield portion compared to the distance from the second conductor to the second side shield portion.

Example 4 can include any of Examples 1-3, further comprising a solder resist layer on the top surface.

Example 5 can include any of Examples 1-4, wherein the one or more first side reference layers and the one or more second side reference layers reside in one or more reference planes.

Example 6 can include any of Examples 1-5, wherein each of the one or more first side reference layers, each of the one or more second side reference layers, and each of the one or more central reference layers comprises a reference voltage.

Example 7 can include any of Examples 1-6, wherein the reference voltage comprises a ground voltage (Vss) or a power supply voltage (Vcc).

Example 8 can include any of Examples 1-7, wherein first conductor and the second conductor carry complementary electrical signals.

Example 9 can include any of Examples 1-8, wherein the electrical signals comprise a differential bus with a transmission data rate of greater than 10 GHz.

Example 10 can include any of Examples 1-9, further comprising a second ground plane on the top surface.

Example 11 can include any of Examples 1-10, wherein the one or more first side reference layers comprises top, middle, and bottom first side references layers, and wherein the one or more second side reference layers comprises top, middle, and bottom side reference layers.

Example 12 can include any of Examples 1-11, wherein the top first side reference layer, the bottom first side reference layer, the top second side reference layer, and the bottom second side reference layer, are each of an approximately equal primary width, and wherein the middle first side reference layer and the middle second side reference layer are of an approximately equal secondary width, wherein the primary width is greater than the secondary width.

Example 13 can include any of Examples 1-12, wherein the one or more first side reference layers and the one or more second side reference layers comprise a concave shape around the first and second conductors.

Example 14 can include any of Examples 1-13, wherein the ratio of the distance from the first conductor to the top first side reference layer of the first side shield portion compared to a parallel distance from the first conductor to the middle first side reference layer of the first side shield portion is about 1:1.2 to about 1:2.

Example 15 can include any of Examples 1-14, wherein the impedance comprises above about 90.0 Ω.

Example 16 can include any of Examples 1-15, wherein the insertion loss at about 28 GHz comprises less than about 0.09 dB/mm.

Example 17 can include any of Examples 1-16, wherein the insertion loss at about 56 GHz comprises less than about 0.15 dB/mm.

Example 18 can include an electronic device, comprising: a assembly including a ground plane; a shield including a central portion, a first side portion, and a second side portion, the central portion situated between the first side portion and the second side portion; a differential pair comprising first and second conductors, the first conductor situated laterally asymmetric between the central portion and the first side portion, the second conductor situated laterally asymmetric between the central portion and the second side portion; a signal transmitter; a signal receiver, the assembly for connecting the signal transmitter to the signal receiver, and conveying a signal from the signal transmitter to the signal receiver.

Example 19 can include Example 18, wherein the assembly comprises a microstrip configuration.

Example 20 can include any of Examples 18-19, wherein the assembly comprises a stripline configuration.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The term "horizontal" as used in this document is defined as a plane parallel to the conventional plane or surface of a die, and any packaging substrate which may be coupled to the die to form a die package, regardless of the actual orientation of the die package at any point in time. The term "vertical" refers to a direction perpendicular to the horizontal as defined above. Prepositions, such as "on," "over," and "under" are defined with respect to the die package with a die located above a package substrate, regardless of the orientation of the die package; and while "on" is intended to suggest a direct contact of one structure relative to another structure which it lies "on"(in the absence of an express indication to the contrary); the terms "over" and "under" are expressly intended to identify a relative placement of structures (or layers, features, etc.), which expressly includes—but is not limited to—direct contact between the identified structures unless specifically identified as such.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. An assembly, comprising:
a ground plane on a bottom surface;
a top surface opposite the bottom surface;
a central shield portion extending between the bottom surface and the top surface, the central shield portion comprising:
one or more central reference layers parallel the ground plane; and
one or more a via vertically coupling together the one or more central reference layers;
a first side shield portion on a first side of the assembly, spaced apart from the central shield portion by a first gap, the first side shield portion comprising:
one or more first side reference layers parallel the ground plane; and
one or more via vertically coupling together the one or more first side reference layers;
a second side shield portion on a second side of the assembly, spaced apart from the central shield portion by a second gap, the second side shield portion comprising:
one or more second side reference layers parallel the ground plane; and
one or more via vertically coupling together the one or more second side reference layers;

a first conductor situated laterally asymmetric in the first gap;

a second conductor situated laterally asymmetric in the second gap, wherein first conductor and the second conductor carry complementary electrical signals; and dielectric interspersed in and around the central shield portion, the first side shield portion, and the second side portion, the dielectric extending from the top surface to the bottom surface.

2. The assembly of claim 1, further comprising a solder resist layer on the top surface.

3. The assembly of claim 1, wherein the one or more first side reference layers and the one or more second side reference layers reside in one or more reference planes.

4. The assembly of claim 1, wherein each of the one or more first side reference layers, each of the one or more second side reference layers, and each of the one or more central reference layers comprises a reference voltage.

5. The assembly of claim 4, wherein the reference voltage comprises a ground voltage (Vss) or a power supply voltage (Vcc).

6. The assembly of claim 1, wherein the electrical signals comprise a differential bus with a transmission data rate of greater than 10 GHz.

7. The assembly of claim 1, further comprising a second ground plane on the top surface.

8. The assembly of claim 1, wherein the one or more first side reference layers comprises top, middle, and bottom first side references layers, and wherein the one or more second side reference layers comprises top, middle, and bottom side reference layers.

9. The assembly of claim 8, wherein the top first side reference layer, the bottom first side reference layer, the top second side reference layer, and the bottom second side reference layer, are each of an approximately equal primary width, and wherein the middle first side reference layer and the middle second side reference layer are of an approximately equal secondary width, wherein the primary width is greater than the secondary width.

10. The assembly of claim 9, wherein the one or more first side reference layers and the one or more second side reference layers comprise a concave shape around the first and second cond rectors.

11. The assembly of claim 9, wherein the ratio of the distance from the first conductor to the top first side reference layer of the first side shield portion compared to a parallel distance from the first conductor to the middle first side reference layer of the first side shield portion is about 1:1.2 to about 1:2.

12. The assembly of claim 1, wherein the impedance comprises above about 90.0 Ω.

13. The assembly of claim 1, wherein the insertion loss at about 28 GHz comprises less than about 0.09 dB/mm.

14. The assembly of claim 1, wherein the insertion loss at about 56 GHz comprises less than about 0.15 dB/mm.

15. An electronic device, comprising:
an assembly comprising:
a ground plane;
a shield comprising:
a central portion;
a first side portion; and
a second side portion, the central portion situated between the first side portion and the second side portion;
a differential pair comprising first and second conductors, the first conductor situated laterally asymmetric between the central portion and the first side portion, the second conductor situated laterally asymmetric between the central portion and the second side portion;
a signal transmitter;
a signal receiver, the assembly for connecting the signal transmitter to the signal receiver, and conveying a signal from the signal transmitter to the signal receiver.

16. The device of claim 15, wherein the assembly comprises a microstrip configuration.

17. The device of claim 15, wherein the assembly comprises a stripline configuration.

18. An assembly, comprising:
a ground plane on a bottom surface;
a top surface opposite the bottom surface;
a central shield portion extending between the bottom surface and the top surface, the central shield portion comprising:
one or more central reference layers parallel the ground plane; and
one or more a via vertically coupling together the one or more central reference layers;
a first side shield portion on a first side of the assembly, spaced apart from the central shield portion by a first gap, the first side shield portion comprising:
one or more first side reference layers parallel the ground plane; and
one or more via vertically coupling together the one or more first side reference layers;
a second side shield portion on a second side of the assembly, spaced apart from the central shield portion by a second gap, the second side shield portion comprising:
one or more second side reference layers parallel the ground plane; and
one or more via vertically coupling together the one or more second side reference layers;
a first conductor situated laterally asymmetric in the first gap;
a second conductor situated laterally asymmetric in the second gap wherein the ratio of the distance from the first conductor to the central shield portion compared to the distance from the first conductor to the first side shield portion is about 1:1.5 to about 1:10; and
dielectric interspersed in and around the central shield portion, the first side shield portion, and the second side portion, the dielectric extending from the top surface to the bottom surface.

19. The assembly of claim 18, wherein the ratio of the distance from the first conductor to the central shield portion compared to the distance from the first conductor to the first side shield portion is about equal to the ratio of the distance from the second conductor to the central shield portion compared to the distance from the second conductor to the second side shield portion.

* * * * *

UNITED STATES PATENT AND TRADEMARK OFFICE
CERTIFICATE OF CORRECTION

| | |
|---|---|
| PATENT NO. | : 11,456,516 B2 |
| APPLICATION NO. | : 17/030634 |
| DATED | : September 27, 2022 |
| INVENTOR(S) | : Ong et al. |

It is certified that error appears in the above-identified patent and that said Letters Patent is hereby corrected as shown below:

In the Claims

In Column 17, Line 43, Claim 10, delete "cond rectors." and insert --conductors.-- therefor Signed and Sealed this
Twenty-fifth Day of July, 2023

Katherine Kelly Vidal
*Director of the United States Patent and Trademark Office*